United States Patent
Kawamura et al.

(10) Patent No.: US 10,146,352 B2
(45) Date of Patent: Dec. 4, 2018

(54) PRESSURE-DETECTING SENSOR

(71) Applicant: Murata Manufacturing Co., Ltd., Nagaokakyo-shi, Kyoto-fu (JP)

(72) Inventors: Hideki Kawamura, Nagaokakyo (JP); Masamichi Ando, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 167 days.

(21) Appl. No.: 15/004,133

(22) Filed: Jan. 22, 2016

(65) Prior Publication Data

US 2016/0154514 A1 Jun. 2, 2016

Related U.S. Application Data

(63) Continuation of application No. PCT/JP2014/070437, filed on Aug. 4, 2014.

(30) Foreign Application Priority Data

Aug. 6, 2013 (JP) .................................. 2013-163148

(51) Int. Cl.
    *G06F 3/041* (2006.01)
    *H01L 41/113* (2006.01)
    *H01L 41/193* (2006.01)

(52) U.S. Cl.
    CPC .......... *G06F 3/0414* (2013.01); *G06F 3/0416* (2013.01); *H01L 41/1132* (2013.01); *H01L 41/193* (2013.01)

(58) Field of Classification Search
    CPC ............................. G06F 3/0414; G06F 3/0416
    See application file for complete search history.

(56) References Cited

U.S. PATENT DOCUMENTS 4,093,885 A * 6/1978 Brown .................. B06B 1/0603
                                                    310/316.01
5,248,998 A * 9/1993 Ochiai .................. B41J 2/1609
                                                    310/333

(Continued)

FOREIGN PATENT DOCUMENTS

JP  H05-61592 A    3/1993
JP  2006-163618 A  6/2006

(Continued)

OTHER PUBLICATIONS

International Search Report issued for PCT/JP2014/070437, dated Oct. 14, 2014.

(Continued)

*Primary Examiner* — Christopher E Leiby
(74) *Attorney, Agent, or Firm* — Arent Fox LLP (57) ABSTRACT

A pressure-detecting sensor that includes a piezoelectric sensor, a rectangular plate member, and an attaching member. The piezoelectric sensor is attached to the plate member via the attaching member so that the piezoelectric sensor is located in the vicinity of an end of the plate member in the longitudinal direction of the plate member, and such that the longitudinal direction of the piezoelectric sensor is parallel to the transverse direction of the plate member. The attaching member is composed of a sticky agent having an elastic constant of $10^6$ Pa or lower. The piezoelectric sensor has a shape having aspect ratio of 2.5 or higher.

8 Claims, 5 Drawing Sheets

(56) References Cited

U.S. PATENT DOCUMENTS

| | | | |
|---|---|---|---|
| 5,311,219 A * | 5/1994 | Ochiai | B41J 2/1609 310/328 |
| 5,765,046 A * | 6/1998 | Watanabe | G01C 19/5642 310/348 |
| 5,959,209 A * | 9/1999 | Takeuchi | G01L 1/16 73/514.34 |
| 6,018,210 A * | 1/2000 | Date | H01L 41/042 310/311 |
| 8,884,897 B2 | 11/2014 | Sashida et al. | |
| 2009/0297776 A1 * | 12/2009 | Crosby | B29C 33/3842 428/152 |
| 2011/0109204 A1 * | 5/2011 | Tajitsu | H01L 41/193 310/348 |
| 2011/0121591 A1 * | 5/2011 | Nishiwaki | B66C 1/445 294/86.4 |
| 2012/0075226 A1 * | 3/2012 | Andoh | G06F 3/046 345/173 |
| 2013/0048597 A1 | 2/2013 | Tanabe et al. | |
| 2014/0049137 A1 | 2/2014 | Ando et al. | |
| 2015/0247765 A1 * | 9/2015 | Ando | G06F 3/0414 310/331 |
| 2015/0326967 A1 * | 11/2015 | Otani | H04R 1/028 381/114 |

FOREIGN PATENT DOCUMENTS

| | | |
|---|---|---|
| JP | 2011-222679 A | 11/2011 |
| JP | 2012-158135 A | 8/2012 |
| JP | 2012-194972 A | 10/2012 |
| JP | 2012-203895 A | 10/2012 |
| JP | 2013-043372 A | 3/2013 |
| WO | WO 2011/125408 A1 | 10/2011 |
| WO | WO 2012/137897 A1 | 10/2012 |
| WO | WO2012137897 A1 * | 10/2012 ............... G01B 7/16 |

OTHER PUBLICATIONS

Written Opinion of the International Searhing Authority issued for PCT/JP2014/070437, dated Oct. 14, 2014.

* cited by examiner

PRESSURE-DETECTING SENSOR

CROSS REFERENCE TO RELATED APPLICATIONS

The present application is a continuation of International application No. PCT/JP2014/070437, filed Aug. 4, 2014, which claims priority to Japanese Patent Application No. 2013-163148, filed Aug. 6, 2013, the entire contents of each of which are incorporated herein by reference.

FIELD OF THE INVENTION

The present invention relates to a pressure-detecting sensor that detects a pressing force with which an operation surface is depressed.

BACKGROUND OF THE INVENTION

Conventionally, various types of operation-detecting sensors that detect an operation performed on an operation surface by an operator have been devised. Examples of operation-detecting sensors include a capacitive type, a thermal resistance type, piezoelectric acoustic type, an infrared sensor type, and the like. In order to detect a pressing force applied to an operation surface, it is necessary to install a pressure-detecting sensor that is different from these types of operation-detecting sensors.

Patent Literature 1 discloses a touch input device including a touch panel that serves as an operation-detecting sensor and a pressure-sensitive sensor that detects a depression of an operation surface. In the touch input device of Patent Literature 1, the pressure-sensitive sensor is placed on a lower surface of the touch panel (i.e., a surface opposite to the operation surface), and is equal in area to the touch panel.

Further, in the touch input device of Patent Literature 1, the operation surface of the touch panel is covered with a protective layer.

Patent Literature 2 discloses an operation input device having matrices of electrodes formed on both sides of a flat-plate piezoelectric body.

Patent Literature 1: JP 5-61592 A
Patent Literature 2: JP 2006-163618 A

SUMMARY OF THE INVENTION

However, the configurations of the conventional technologies described above present the following problems.

The touch input device disclosed in Patent Literature 1 is configured such that a depression of the operation surface by an operator is detected by the pressure-sensitive sensor via the protective membrane and the touch panel. This may make it impossible to surely detect a pressing force. Moreover, in attaching the touch input device to a portable terminal, a member typically made of glass or the like and having rigidity is attached to the operation surface. This makes it even harder to surely detect a pressing force.

Further, the operation input device disclosed in Patent Literature 2 may not be able to surely detect a pressing force, because the matrices of electrodes are composed of linear electrodes and the operation input device detects depression-induced charge with such matrices of electrodes. Moreover, in attaching the operation input device to a portable terminal, too, a member typically made of glass or the like and having predetermined rigidity is attached to the operation surface. This makes it even harder to surely detect a pressing force, as in the case of the operation input device disclosed in Patent Literature 1.

Therefore, it is an object of the present invention to provide a pressure-detecting sensor that can more surely detect a pressing force.

A pressure-detecting sensor according to this invention has the following configurations as its features. The pressure-detecting sensor includes a plate member having a first principal surface that serves as an operation surface, a flat-membrane piezoelectric sensor, and an attaching member. The attaching member is composed of a sticky agent. The flat-membrane piezoelectric sensor is attached to a second principal surface of the plate member, and includes a piezoelectric film and detecting electrodes formed on both principal surfaces, respectively, of the piezoelectric film. The flat-membrane piezoelectric sensor is attached to the plate member via the attaching member. The flat-membrane piezoelectric sensor has a shape with a longitudinal direction and a transverse direction, and a length of the flat-membrane piezoelectric sensor in the longitudinal direction is 2.5 or more times greater than a length of the flat-membrane piezoelectric sensor in the transverse direction.

In this configuration, strain in the plate member that is produced when the operation surface of the plate member is depressed causes the piezoelectric film to be effectively strained and generate charge. In this case, the use of the present configuration eliminates the presence of a location of pressure where the charge is 0, thus making it possible to surely detect charge that is generated by the piezoelectric film in response to a pressing force.

Further, the pressure-detecting sensor according to this invention is preferably configured such that the attaching member has an elastic constant of $10^6$ Pa or lower.

This configuration can more surely prevent charge from becoming 0, thus making it possible to more surely detect a pressing force.

Further, the pressure-detecting sensor according to this invention is preferably configured such that the plate member has a shape with a longitudinal direction and a transverse direction and such that the flat-membrane piezoelectric sensor is attached to the plate member so that the transverse direction of the plate member extends along the longitudinal direction of the flat-membrane piezoelectric sensor. It should be noted that the shape of the plate member is for example a rectangle. Further, it is more preferable that the location of attachment of the piezoelectric sensor be the vicinity of one end of the longitudinal direction of the plate member.

In this configuration, the piezoelectric sensor is attached to such a location as to easily sense strain produced when the operation surface of the plate member is pressed. This makes it possible to more surely detect a pressing force.

Further, the pressure-detecting sensor according to this invention is preferably configured such that the piezoelectric film used in the piezoelectric sensor contains polylactic acid.

In this configuration, strain produced when the operation surface of the plate member is pressed causes charge to be produced by the piezoelectric strain constant $d_{14}$ of polylactic acid. Polylactic acid produces charge by expanding and contracting in a planar direction, thus making it possible to increase the precision of detection of a pressing force from strain in the plate member.

This invention makes it possible to surely detect a pressing force applied to the operation surface.

DETAILED DESCRIPTION OF THE INVENTION

Figure 1:
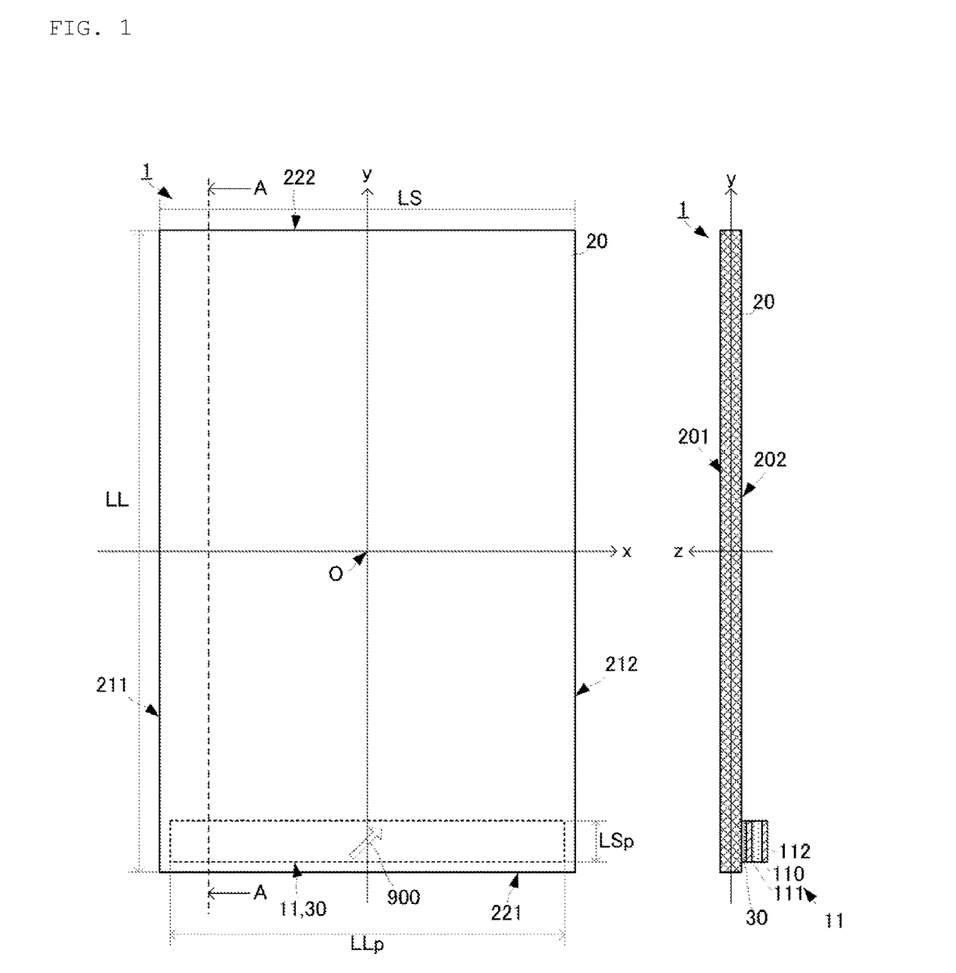
FIG. 1 is a plan view and a side cross-sectional view of a pressure-detecting sensor according to an embodiment of the present invention.

A pressure-detecting sensor according to an embodiment of the present invention is described with reference to the drawings. FIG. 1 is a plan view and a side cross-sectional view of the pressure-detecting sensor according to the embodiment of the present invention. The cross-sectional view shown in FIG. 1 is one taken along line A-A in the plan view.

The pressure-detecting sensor 1 includes a piezoelectric sensor 11, a plate member 20, and an attaching member 30. The piezoelectric sensor 11 includes a piezoelectric film 110 and detecting electrodes 111 and 112.

The piezoelectric film 110 is composed of polylactic acid (PLA), or more specifically, poly(L-lactic acid) (PLLA). The piezoelectric film 110 takes the form of an oblong flat membrane having a length (longitudinal-direction length) LLp and a width (transverse-direction length) LSp that is shorter than the length LLp. It should be noted that although the piezoelectric film 110 is thus in the shape of an oblong or rectangle, the piezoelectric film 110 needs only have a shape with a longitudinal direction and a transverse direction. For example, the piezoelectric film 110 may be in the shape of an oval, an ellipse, a polygon such as a structure formed by chamfering the corners of a rectangle, or a partially-rounded shape.

The piezoelectric film 110 has a direction of molecular orientation 900 at an angle of 45 degrees with respect to the longitudinal and transverse directions of the piezoelectric film 110. In other words, the piezoelectric film 110 has a direction of uniaxial drawing at an angle of substantially 45 degrees with respect to the longitudinal and transverse directions of the piezoelectric film.

It should be noted that the description of the present embodiment illustrates the piezoelectric film with the dimensions 60 mm in LLp by 6 mm in LSp and the plate member with the dimensions 80 mm in LL by 60 mm in LS.

The properties of the PLLA, from which the piezoelectric film 110 is made, are described here.

PLLA is composed of a chiral polymer. The main chain of PLLA has a helical structure. PLLA is composed of molecules oriented in the direction in which it was uniaxially drawn, and the orientation of the molecules imparts piezoelectricity to PLLA. Moreover, when uniaxially drawn, PLLA generates charge due to strain produced in the piezoelectric film 110. Note here that the strain produced in the piezoelectric film 110 means stretching of the piezoelectric film 110 in a predetermined direction. In this case, the amount of charge that is generated is determined by the amount of strain in the piezoelectric film 110. The piezoelectric constant of uniaxially-drawn PLLA is one of the very high piezoelectric constants among polymers. For example, PLLA can achieve a high piezoelectric strain constant $d_{14}$ of 10 to 20 pC/N if the conditions, such as a condition during drawing, a heat treatment condition, and the formulation of additives, are right.

It is preferable that the piezoelectric film 110 have a draw ratio of approximately 3 to 8 times. Heat treatment after drawing facilitates the extended-chain crystallization of polylactic acid and thus improves the piezoelectric constant. It should be noted that, in the case of biaxial drawing, effects which are similar to those of uniaxial drawing can be brought about by applying different draw ratios to the respective axes. For example, in the case of applying a drawing of 8 times to an X axis extending in a direction and a drawing of 2 times to a Y axis extending in a direction orthogonal to the X axis, effects which are substantially the same as those brought about by applying an uniaxial drawing of approximately 4 times to the X-axis direction can be brought about in terms of piezoelectric constant. A simply uniaxially-drawn film tears easily along the direction in which it was drawn, but can have somewhat increased strength when subjected to such biaxial drawing.

Further, unlike other polymers such as PVDF or piezoelectric ceramics, PLLA does not require poling processing because it produces piezoelectricity through molecular orientation processing such as drawing. That is, the piezoelectricity of PLLA, which does not fall under the category of ferroelectric substances, is not expressed by ionic polarization, unlike in the case of a ferroelectric substance such as PVDF or PZT, but is derived from the helical structure, which is a distinctive structure of the molecules. For this reason, PLLA does not produce pyroelectricity, which other ferroelectric substances produce. Furthermore, while PVDF and the like show fluctuations in piezoelectric constant over time and, in some cases, show marked drops in piezoelectric constant, PLLA is highly stable in piezoelectric constant over time. Therefore, the amount of output charge is not affected by the ambient environment.

The detecting electrode 111 is formed substantially all over a first flat-plate surface (principal surface) of the piezoelectric film 110. The detecting electrode 112 is formed substantially all over a second flat-plate surface (principal surface) of the piezoelectric film 110. It is preferable that the detecting electrodes 111 and 112 be either organic electrodes composed mostly of polythiophene or polyaniline or inorganic electrodes such as ITO, ZnO, silver nanowires, carbon nanotubes, or graphene. The use of these materials enables the formation of highly translucent conductor patterns.

The plate member 20 is in the shape of a rectangle having a length LL in a first direction (y direction) and a length LS in a second direction (x direction) orthogonal to the first direction, and has a predetermined thickness. The plate member 20 is made of a material having a certain degree of rigidity, and is formed for example by a flat plate of glass. The plate member 20 includes a first principal surface 201, a second principal surface 202, an edge side 211 at a first end in the direction of the length LS of the plate member 20, and an edge side 212 at a second end in the direction of the length LS of the plate member 20.

The plate member 20 includes an edge side 221 at a first end in the direction of the length LL of the plate member 20 and an edge side 222 at a second end in the direction of the length LL of the plate member 20. It should be noted that although the plate member 20 is thus rectangular, the term "substantially rectangular" as used herein encompasses a polygon such as a structure formed by chamfering the corners of a rectangle and a partially-rounded shape.

The plate member 20 has its peripheral sides fixed by a frame body (not illustrated) or the like. Therefore, when an operator depresses an operation surface, which is the first principal surface, the plate member 20 is deflected in a form that displaces the location of depression in a direction orthogonal to the operation surface in such a manner that the amount of displacement becomes smaller toward the periphery from the location of depression as the center.

The piezoelectric sensor 11, which includes the piezoelectric film 110, is placed in the vicinity of the first end in the longitudinal direction (i.e., the y direction shown in FIG. 1) of the plate member 20, i.e., in the vicinity of the edge side 221. In this case, the piezoelectric sensor 11 is placed on the plate member 20 so that the longitudinal direction of the piezoelectric sensor 11 extends along the transverse direction (i.e., the x direction shown in FIG. 1) of the plate member 20. Note here that the aspect in which the piezoelectric sensor 11 is placed on the plate member 20 so that the longitudinal direction of the piezoelectric sensor 11 extends along the transverse direction of the plate member 20 encompasses an aspect in which the longitudinal direction of the piezoelectric sensor 11 is slightly not parallel to the transverse direction of the plate member 20, as well as an aspect in which the longitudinal direction of the piezoelectric sensor 11 is parallel to the transverse direction of the plate member 20. However, it is preferable that the longitudinal direction of the piezoelectric sensor 11 be parallel to the transverse direction of the plate member 20. Further, the piezoelectric sensor 11 is placed so that the flat-plate surfaces of the piezoelectric sensor 11 is parallel to the principal surfaces of the plate member 20. The piezoelectric sensor 11 is placed on the second principal surface of the plate member 20 opposite to the operation surface.

The piezoelectric sensor 11 is attached to the plate member 20 via the attaching member 30. More specifically, a detecting electrode 111 side surface of the piezoelectric sensor 11 is attached to the second principal surface of the plate member 20 via the attaching member 30. In this case, the attaching member 30 is provided on substantially the whole surface where the piezoelectric sensor 11 is in contact with the plate member 20.

In such a configuration, the attachment of the piezoelectric sensor 11 to the plate member 20 allows the aforementioned deflection of the plate member 20 due to the depression of the operation surface of the plate member 20 to be conveyed to the piezoelectric sensor 11 via the attaching member 30 so that the piezoelectric film 110 of the piezoelectric sensor 11 stretches in the longitudinal and transverse directions. This causes the piezoelectric film 110 to strain in the longitudinal and transverse directions and generate charge in response to the strain. This charge is taken out to an external detection circuit (not illustrated) by the detecting electrodes 111 and 112 and can be detected as a voltage. In this case, as mentioned above, the amount of charge is determined by the amount of strain in the piezoelectric film 110. Furthermore, the amount of strain in the piezoelectric film 110 is determined by the amount of deflection of the plate member 20 that is conveyed via the attaching member 30, and the amount of deflection is determined by a pressing force applied to the operation surface. Therefore, the pressing force applied to the operation surface can be detected by measuring a voltage value obtained from the detecting electrodes 111 and 112 of the piezoelectric sensor 11.

Note here that in such a case as that mentioned above where the direction of orientation 900 of the piezoelectric film 110 is at an angle of substantially 45 degrees with respect to the longitudinal and transverse directions, charge due to strain in the longitudinal direction of the piezoelectric film 110 is opposite in polarity to charge due to strain in the transverse direction of the piezoelectric film 110. Therefore, the generated charge may become substantially 0 depending on the location of pressure because the charge generated by stretching in the longitudinal direction and the charge generated by stretching in the transverse direction greatly cancel each other out. However, the use of the configuration according to the present embodiment makes it possible to prevent the generated charge from thus becoming substantially 0 depending on the location of pressure.

Specifically, a sticky agent is used as the attaching member 30. More preferably, a sticky agent having an elastic constant of $10^6$ Pa or lower is used as the attaching member 30.

Further, the aspect ratio of the piezoelectric film 110, i.e., the ratio of the longitudinal-direction length LLp to the transverse-direction length LSp (LLp/LSp) is 2.5 or higher.

Figure 2A:
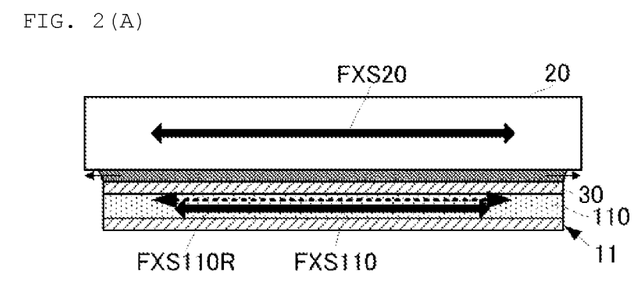
FIGS. 2(A) and 2(B) are conceptual diagrams showing how strain is conveyed in a case where a sticky agent is used as an attaching member.
Figure 2B:
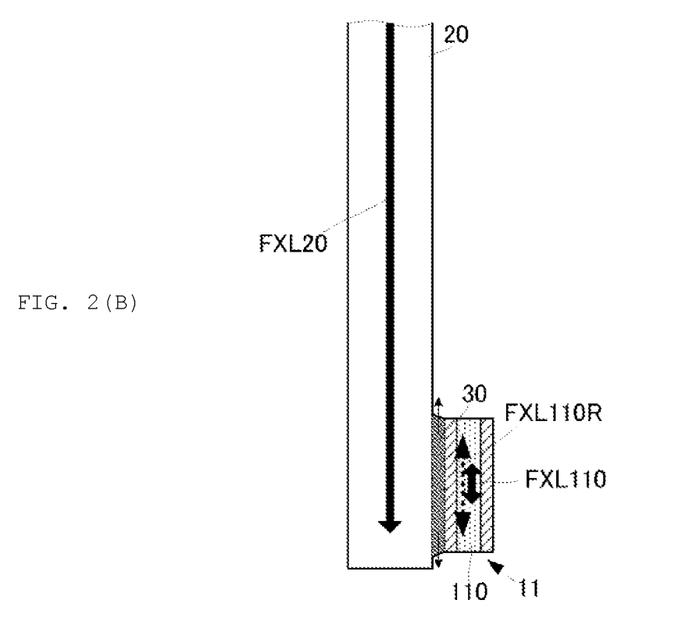

FIGS. 2(A) and 2(B) are conceptual diagrams showing how strain is conveyed in a case where a sticky agent is used as the attaching member. FIG. 2(A) is a side view of the transverse direction of the plate member 20 (i.e. the longitudinal direction of the piezoelectric sensor 11), and FIG. 2(B) is a side view of the longitudinal direction of the plate member 20 (i.e. the transverse direction of the piezoelectric sensor 11). It should be noted that FIGS. 2(A) and 2(B) omit to illustrate the state of being deflected.

Application of a pressing force to the operation surface of the plate member 20 causes strain including longitudinal-direction strain FXL20 and transverse-direction strain FXS20 to be generated in the plate member 20 as shown in FIGS. 2(A) and 2(B).

When the plate member 20 is strained, the piezoelectric film 110 of the piezoelectric sensor 11 attached to the plate member 20 via the attaching member 30 is strained, too. Strain FXL110 is generated in the piezoelectric film 110 in response to the longitudinal-direction strain FXL20 in the plate member 20. The longitudinal direction of the plate member 20 is orthogonal to the longitudinal direction of the piezoelectric film 110. In other words, the transverse direction of the piezoelectric film 110 is parallel to the longitudinal direction of the plate member 20. Therefore, the strain FXL110 is generated along the transverse direction of the piezoelectric film 110.

Further, strain FXS110 is generated in the piezoelectric film 110 in response to the transverse-direction strain FXS20 in the plate member 20. The transverse direction of the plate member 20 is orthogonal to the transverse direction of the piezoelectric film 110. In other words, the longitudinal direction of the piezoelectric film 110 is parallel to the transverse direction of the plate member 20. Therefore, the strain FXS110 is generated along the longitudinal direction of the piezoelectric film 110.

Strain in each direction is conveyed via the attaching member 30, and since the attaching member 30 is a sticky agent, i.e., since the attaching member 30 has a relatively low elastic constant, the attaching member 30 stretches and the strain is relaxed. Therefore, the magnitude of strain that is produced in the piezoelectric film 110 becomes smaller than the magnitude of strain produced in the plate member 20. In this case, the attaching member 30, which is a sticky agent, stretches more at its ends, where the strain is easily relaxed.

Therefore, in the transverse direction of the piezoelectric film 110, in which the length of the attaching member 30 is short, the relaxation effect is great at the ends, where the longitudinal-direction strain FXL20 in the plate member 20 is greatly relaxed. Therefore, the strain FXL110 along the transverse direction of the piezoelectric film 110 becomes smaller. For example, the dashed arrow FXL110R shown in FIG. 2(B) indicates a case where the piezoelectric sensor 11 is attached to the plate member 20 with an adhesive agent, i.e., a case where the piezoelectric sensor 11 is firmly fixed to the plate member 20. As shown in FIG. 2(B), the use of a sticky agent as the attaching member 30 can cause the strain FXL110 that is produced in the piezoelectric film 110 to be much smaller than it is in the case where the piezoelectric sensor 11 is firmly fixed to the plate member 20.

On the other hand, in the longitudinal direction of the piezoelectric film 110, in which the length of the attaching member 30 is great, the relaxation effect is small at the ends, where the effect of relaxing the transverse-direction strain FXS20 in the plate member 20 is small. Therefore, the strain FXS110 along the longitudinal direction of the piezoelectric film 110 only becomes slightly smaller than the transverse-direction strain FXS20 produced in the plate member 20. For example, the dashed arrow FXS110R shown in FIG. 2(A) indicates a case where the piezoelectric sensor 11 is attached to the plate member 20 with an adhesive agent, i.e., a case where the piezoelectric sensor 11 is firmly fixed to the plate member 20. As shown in FIG. 2(A), the strain FXL110 that is produced in the piezoelectric film 110 is not greatly attenuated, although the use of a sticky agent as the attaching member 30 causes the strain FXL110 to be slightly smaller than it is in the case where the piezoelectric sensor 11 is firmly fixed to the plate member 20.

This causes the strain FXL110 along the transverse direction of the piezoelectric film 110 to be suppressed, and the charge that is generated by the strain FXL110 becomes very small. On the other hand, the charge that is generated by the strain FXS110 along the longitudinal direction of the piezoelectric film 110 hardly becomes smaller. Therefore, the charge that is generated by the strain FXS110 is not canceled out by the charge that is generated by the strain FXL110.

Figure 3:
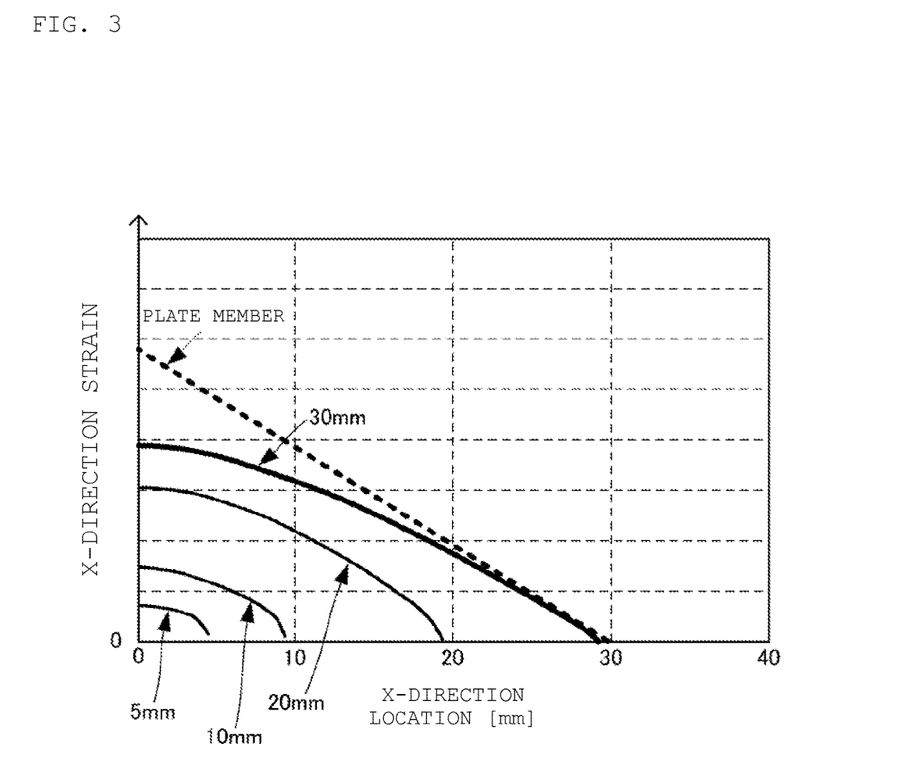
FIG. 3 is a diagram showing changes in magnitude of strain that is produced by a piezoelectric sensor (piezoelectric film), with varied lengths in the longitudinal direction of the piezoelectric sensor.

FIG. 3 is a diagram showing the magnitude of strain that is produced in the piezoelectric sensor (i.e., strain along the longitudinal direction of the piezoelectric sensor (i.e., the transverse direction of the plate member)), with varied lengths in the longitudinal direction of the piezoelectric sensor (piezoelectric film). It should be noted that FIG. 3 shows only the positive direction of the X axis, assuming the position O in FIG. 1 as x=0 (and omits to show the negative part of the X axis, which is bilaterally symmetrical). The dashed line in FIG. 3 indicates strain in the plate member 20. It can be confirmed that the shorter the piezoelectric sensor becomes in length, the greater relaxation effect the sticky agent brings about and the harder it becomes for the strain in the plate member surface to be conveyed to the piezoelectric film. For the same reason, the relaxation effect is greater in the transverse direction than in the longitudinal direction.

Figure 4A:
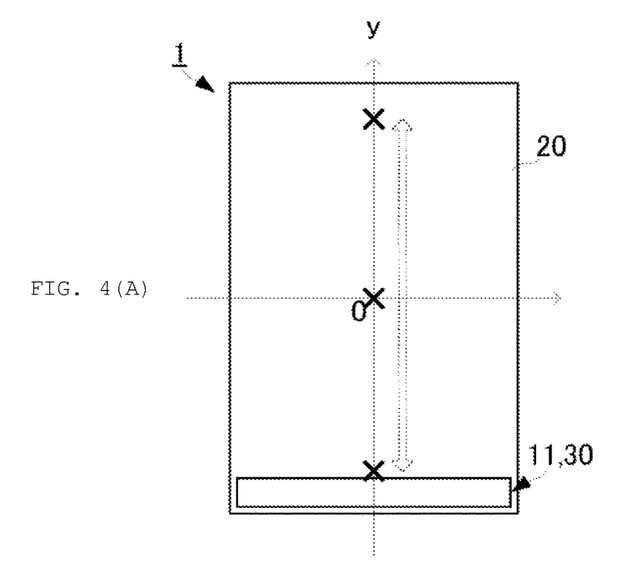
FIGS. 4(A) and 4(B) are diagrams showing changes in sensor output depending on the location of pressure.
Figure 4B:
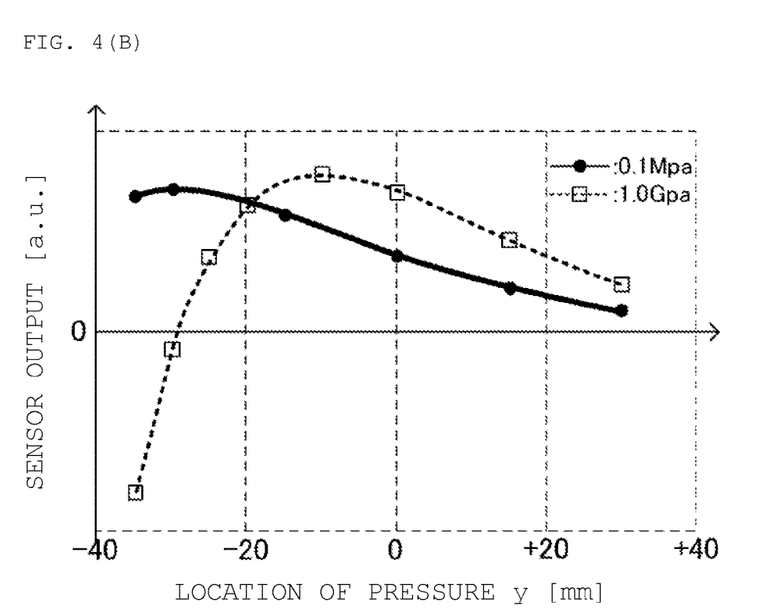

FIGS. 4(A) and 4(B) are diagrams showing changes in sensor output depending on the location of pressure. FIG. 4(A) is a diagram explaining the location of pressure, and FIG. 4(B) is a diagram showing the dependency of the sensor output on the elastic constant and the location of pressure. In FIG. 4(B), the solid line indicates a case of the configuration according to the present embodiment where a sticky agent is used, or more specifically, a case where a sticky agent having an elastic constant of 0.1 MPa is used. The dashed line indicates a case where an adhesive agent is used, or more specifically, a case where an adhesive agent having an elastic constant of 1.0 GPa is used.

As shown in FIG. 4(A), the location of pressure is moved along the longitudinal direction of the plate member 20. In this case, the location of pressure is any location in the longitudinal direction that is at the center of the transverse direction. As shown in FIG. 4(B), in a case where an adhesive agent is used, the sensor output becomes 0 when the location of pressure is a characteristic location close to the piezoelectric sensor 11. That is, the charge that is generated by the piezoelectric film 110 becomes 0. Then, pressing a location that is closer to the piezoelectric film 110 than the characteristic location causes the sensor output to take on a negative value, and pressing a location that is farther away from the piezoelectric film 110 than the characteristic location causes the sensor output to take on a positive value. That is, the polarity of the sensor output is reversed depending on the location of pressure.

On the other hand, as shown in FIG. 4(B), in such a case as the configuration according to the present embodiment where a sticky agent is used, the sensor output always takes on a positive value, albeit smaller in absolute value, depending on the location of pressure, than in a case where an adhesive agent is used.

The use of a sticky agent as the attaching member 30 according to the present embodiment allows the sensor output to take on a positive value regardless of the location of pressure, thus making it possible to surely detect a pressing force applied to the plate member 20.

FIG. 4(B) shows characteristics that are obtained in cases where the elastic constant is 0.1 MPa and 1.0 GPa. Meanwhile, in a case where the elastic constant ranges from 0.1 MPa to 1.0 GPa, characteristics that lie between these characteristic curves are obtained. Moreover, such a characteristic is obtained that the sensor output takes on a positive value regardless of the location of pressure, provided the elastic constant is 1.0 MPa or lower. Therefore, it is preferable that a sticky agent having an elastic constant of $1.0 \times 10^6$ Pa or lower be used.

Figure 5A:
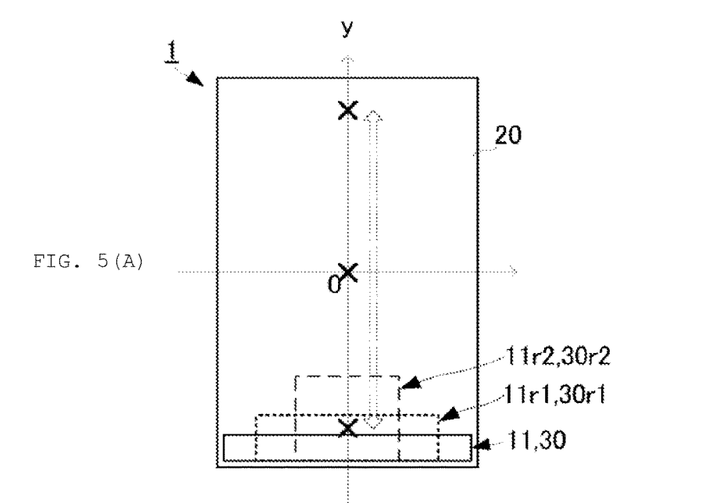
FIGS. 5(A) and 5(B) are diagrams showing changes in sensor output depending on the aspect ratio of the piezoelectric film.
Figure 5B:
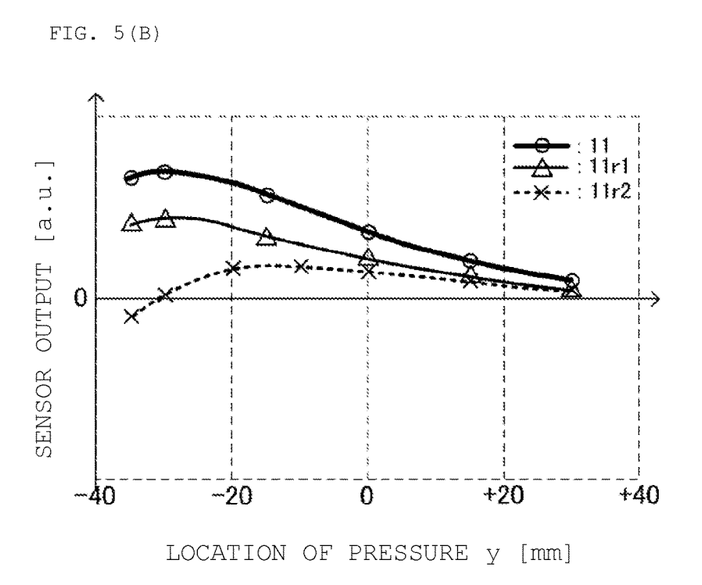

The following describes the aspect ratio of the piezoelectric film. The aspect ratio is given by a value (LLp/LSp) obtained by dividing the longitudinal-direction length LLp of the piezoelectric film by the transverse-direction length LSp of the piezoelectric film with reference to the transverse-direction length LSp. FIGS. 5(A) and 5(B) are diagrams showing changes in sensor output depending on the aspect ratio of the piezoelectric film. FIG. 5(A) is a diagram explaining the aspect ratio of the piezoelectric film (piezoelectric sensor) and the location of pressure, and FIG. 5(B) is a diagram showing the dependency of the sensor output on the aspect ratio and the location of pressure. FIG. 5(B) shows the results of experiments with piezoelectric sensors of the same area and varied aspect ratios. In the experiments, the piezoelectric sensors were placed so that the area is bilaterally symmetrical with respect to y=0.

As shown in FIG. 5(A), samples 11r1 and 11r2 of the piezoelectric sensor 11 with varied aspect ratios are prepared. The aspect ratios of the piezoelectric sensor 11, the sample 11r1, and the sample 11r2 are 10, 2.5, and 1, respectively.

As shown in FIG. 5(B), the piezoelectric sensor 11 and the sample 11r1 can yield positive values of sensor output regardless of the location of pressure, but the sample 11r2 yields a sensor output of 0 depending on the location of pressure, at which the sensor output is reversed.

Thus, a piezoelectric sensor (piezoelectric film) having an aspect ratio of 2.5 or higher yields a positive value of sensor output regardless of the location of pressure.

As described above, the use of a pressure-detecting sensor configured according to the present embodiment makes it possible to surely detect a pressing force applied to an operation surface.

Although the foregoing description assumes that one piezoelectric sensor is attached to the plate member, a plurality of piezoelectric sensors may be placed on the plate member. In a case where the plate member is rectangular, it is possible to use any of the following aspects: an aspect in which the piezoelectric sensors are placed on the same side, an aspect in which the piezoelectric sensors are placed on adjacent sides, an aspect in which the piezoelectric sensors are placed on opposite sides, and an aspect in which the piezoelectric sensors are placed on all sides. It is only necessary to choose any of the placements as appropriate according to the specifications.

Further, although the foregoing description shows an example where the direction of orientation 900 of the piezoelectric film 110 is at an angle of 45 degrees with respect to the longitudinal and transverse directions of the piezoelectric film 110, the angle needs only be substantially 45 degrees. For example, the angle between the direction of orientation 900 and the longitudinal direction of the piezoelectric film 110 may range for example from 30 degrees to 60 degrees. However, when the angle between the direction of orientation 900 and the longitudinal direction of the piezoelectric film 110 is 45 degrees, a pressing force can be detected with higher sensitivity than at any other angle.

Further, although it is more preferable that the location of attachment of the piezoelectric sensor be the vicinity of one end of the longitudinal direction of the plate member, the location of attachment of the piezoelectric sensor may be another location. However, in the case of an electronic device structured such that the vicinity of ends of the plate member cannot be seen from outside, a piezoelectric sensor having no translucency can also be used when the location of attachment of the piezoelectric sensor is the vicinity of one end of the longitudinal direction of the plate member.

DESCRIPTION OF REFERENCE SYMBOLS

1 Pressure-detecting sensor
11 Piezoelectric sensor
11*r*1, 11*r*2: Sample
20 Plate member
30 Attaching member
110 Piezoelectric film
111, 112 Detecting electrode
201 First principal surface
202 Second principal surface
211, 212, 221, 222 Edge side
900 Direction of orientation

The invention claimed is:
1. A pressure-detecting sensor comprising:
a plate member having a first principal surface and a second principal surface opposed to the first principal surface;
a piezoelectric sensor attached to the second principal surface of the plate member, the piezoelectric sensor including a piezoelectric film and detecting electrodes on opposed principal surfaces, respectively, of the piezoelectric film, the piezoelectric sensor having a longitudinal direction and a transverse direction, a length of the piezoelectric sensor in the longitudinal direction being 2.5 or more times greater than a width of the piezoelectric sensor in the transverse direction; and
an attaching member via which the piezoelectric sensor is attached to the second principal surface of the plate member, the attaching member having an elastic constant of less than or equal to $10^6$ Pa whereby the piezoelectric sensor yields a positive value of sensor output in response to the application of pressure to an active surface of the plate member irrespective of where on the active surface the pressure is applied.

2. The pressure-detecting sensor according to claim 1, wherein:
the plate member has a longitudinal direction and a transverse direction, and
the piezoelectric sensor is attached to the plate member so that the transverse direction of the plate member extends along the longitudinal direction of the piezoelectric sensor.

3. The pressure-detecting sensor according to claim 2, wherein the piezoelectric sensor is located proximal to a first end of the plate member in the longitudinal direction of the plate member.

4. The pressure-detecting sensor according to claim 1, wherein the piezoelectric film contains polylactic acid.

5. The pressure-detecting sensor according to claim 1, wherein the piezoelectric film has a direction of molecular orientation at an angle of 45 degrees with respect to the longitudinal and transverse directions of the piezoelectric film.

6. The pressure-detecting sensor according to claim 1, wherein the piezoelectric film has a direction of molecular orientation at an angle between 30 and 60 degrees with respect to the longitudinal direction of the piezoelectric film.

7. The pressure-detecting sensor according to claim 1, wherein the piezoelectric film contains poly(L-lactic) acid.

8. The pressure-detecting sensor according to claim 1, wherein the plate member is glass.

* * * * *